US009153845B2

(12) United States Patent
Tanaka et al.

(10) Patent No.: US 9,153,845 B2
(45) Date of Patent: Oct. 6, 2015

(54) LITHIUM ION BATTERY CONTROL SYSTEM AND ASSEMBLED BATTERY CONTROL SYSTEM

(75) Inventors: Akihide Tanaka, Hitachinaka (JP); Etsuko Nishimura, Hitachiota (JP)

(73) Assignee: Hitachi, Ltd., Tokyo (JP)

( * ) Notice: Subject to any disclaimer, the term of this patent is extended or adjusted under 35 U.S.C. 154(b) by 440 days.

(21) Appl. No.: 13/570,441

(22) Filed: Aug. 9, 2012

(65) Prior Publication Data

US 2013/0069598 A1 Mar. 21, 2013

(30) Foreign Application Priority Data

Sep. 20, 2011 (JP) ................................. 2011-204034

(51) Int. Cl.
| | |
|---|---|
| *H02J 7/00* | (2006.01) |
| *H01M 10/44* | (2006.01) |
| *H01M 10/0525* | (2010.01) |
| *H01M 10/42* | (2006.01) |
| *B60L 11/18* | (2006.01) |
| *G01R 31/36* | (2006.01) |

(52) U.S. Cl.
CPC ........... *H01M 10/44* (2013.01); *B60L 11/1803* (2013.01); *B60L 11/1857* (2013.01); *B60L 11/1866* (2013.01); *B60L 11/1879* (2013.01); *G01R 31/3679* (2013.01); *H01M 10/0525* (2013.01); *H01M 10/425* (2013.01); *H01M 10/441* (2013.01); *B60L 2200/26* (2013.01); *B60L 2240/545* (2013.01); *B60L 2240/547* (2013.01); *B60L 2240/549* (2013.01); *Y02E 60/122* (2013.01); *Y02T 10/7005* (2013.01); *Y02T 10/7011* (2013.01); *Y02T 10/7061* (2013.01)

(58) Field of Classification Search
CPC ..... H01M 10/44; H01M 10/441; H02J 7/007; G01R 31/3662; G01R 31/3679
USPC .......................................................... 320/134
See application file for complete search history.

(56) References Cited

U.S. PATENT DOCUMENTS

| | | | | |
|---|---|---|---|---|
| 6,204,634 | B1 * | 3/2001 | Zimmerman et al. | 320/128 |
| 8,102,152 | B2 | 1/2012 | Ugaji et al. | |
| 2010/0052617 | A1 * | 3/2010 | Aridome et al. | 320/132 |
| 2010/0156351 | A1 | 6/2010 | Ugaji et al. | |
| 2011/0089907 | A1 * | 4/2011 | Bhardwaj et al. | 320/136 |
| 2011/0112781 | A1 * | 5/2011 | Anderson et al. | 702/63 |
| 2012/0119749 | A1 * | 5/2012 | Iida | 324/435 |

FOREIGN PATENT DOCUMENTS

JP 2008-192607 A 8/2008

* cited by examiner

*Primary Examiner* — Jack Chiang
*Assistant Examiner* — Brandon Bowers
(74) *Attorney, Agent, or Firm* — Crowell & Moring LLP

(57) ABSTRACT

A lithium ion battery control system includes a degradation rate calculating unit, a degradation rate storage unit, a degradation rate comparing unit, a charging and discharging control circuit, and a rechargeable battery. The degradation rate calculating unit calculates a degradation rate when receiving a trigger for starting the check of the degradation rate of the battery. The degradation rate comparing unit receives a present degradation rate from the degradation rate calculating unit and a previous degradation rate from the degradation rate storage unit and compares both degradation rates. As a result, when the present degradation rate is greater than the previous degradation rate by a predetermined value, a charging and discharging condition is limited.

16 Claims, 7 Drawing Sheets

LITHIUM ION BATTERY CONTROL SYSTEM AND ASSEMBLED BATTERY CONTROL SYSTEM

BACKGROUND OF THE INVENTION

1. Field of the Invention

The present invention relates to a lithium ion battery control system controlling charging and discharging of a lithium ion battery.

2. Background Art

Since they have a high energy densities, lithium ion batteries have attracted attention as batteries used in vehicles such as railroad cars and automobiles or used to store power generated through photovoltaic power generation or wind power generation and to supply the power to power systems. For example, when a lithium ion battery (hereinafter, appropriately referred to as "battery") is mounted on a vehicle, examples of such a vehicle include zero-emission electric vehicles without an engine mounted, hybrid electric vehicles with both an engine and a rechargeable battery mounted, and plug-in hybrid electric vehicles charged directly from a system power source. Such batteries are expected to be used in a stationary power storage system supplying power at the time of emergency in which a normal power supply system is out of order.

Superior durability is required for batteries for such various uses. For example, even when the environmental temperature is raised or a charging-discharging cycle is repeated, it is necessary that the decreasing rate of rechargeable battery capacity (that is, battery capacity) is low and the retention rate of the battery capacity is high for a long period of time; The conservation characteristics and the cycle life, for example, under high-temperature circumstances of 60° C. or higher becomes significant requirements due to radiant heat from the road surface or heat conduction from the interior of the vehicle.

However, in the lithium ion batteries, a degradation in battery capacity is caused by exposing the lithium ion batteries to high-temperature circumstances or performing charging-discharging cycles on the lithium ion batteries. The degradation in capacity becomes marked when the lithium ion batteries are exposed to high voltages or the cycle is performed with a wide voltage range or with a large current.

In consideration of such situations, for example, JP-A-2008-192607 discloses a degradation suppressing method of calculating a degraded state (SOH: State Of Health) from a difference between a charging-discharging cutoff voltage and an open circuit voltage after the charging-discharging and changing the charging-discharging time and the charging-discharging cutoff voltage on the basis of the calculated SOH.

SUMMARY OF THE INVENTION

The inventors actively studied the cycle characteristics and found that the degradation of a battery may be accelerated when the cycle degradation progresses. This degradation greatly depends on the driving method of a lithium ion battery, environmental factors such as temperatures, manufacturing deviations, and the like. Even in batteries manufactured under the same conditions, the acceleration of degradation occurs with different values of the SOH of the batteries.

The battery driving method or the environmental factors such as temperatures greatly depend on a user's usage pattern. Accordingly, it is difficult to utilize the degradation suppressing method of setting the charging and discharging control in advance using the absolute value of the SOH described in JP-A-2008-192607. It is also difficult to cope with the manufacturing deviations through the use of the method described in JP-A-2008-192607.

The invention is made to solve the above-mentioned problems. An object thereof is to provide a lithium ion battery control system which can enable improvement of cycle characteristics of a lithium ion battery.

The inventors performed intensive studies in order to solve the above-mentioned problems, thus found that a lithium ion battery control system can be provided which can enable the improvement of the cycle characteristics of a lithium ion battery by appropriately changing a charging and discharging condition when a predetermined condition is satisfied on the basis of a degradation rate ($\Delta$SOH) of the battery, and finally reached the invention.

The features of the invention are as follows.

(1) A lithium ion battery control system including: a charging and discharging control circuit that controls charging and discharging of a lithium ion battery; a degradation rate storage unit that stores a previous degradation rate of the lithium ion battery; a degradation rate calculating unit that calculates a present degradation rate of the lithium ion battery; and a degradation rate comparing unit that compares the present degradation rate with the previous degradation rate and that sends a signal for changing a charging and discharging condition of the lithium ion battery to the charging and discharging control circuit when the present degradation rate is greater than the previous degradation rate by a predetermined value.

(2) The lithium ion battery control system, wherein degradation rates before and after charging and discharging the lithium ion battery by a predetermined capacity are used as the present degradation rate and the previous degradation rate.

(3) The lithium ion battery control system, wherein the charging and discharging condition to be changed includes lowering an upper-limit charging current.

(4) The lithium ion battery control system, wherein the charging and discharging condition to be changed includes lowering an upper-limit discharging current.

(5) The lithium ion battery control system, wherein the charging and discharging condition to be changed includes lowering an upper-limit charging voltage.

(6) The lithium ion battery control system, wherein the charging and discharging condition to be changed includes raising a lower-limit discharging voltage.

(7) The lithium ion battery control system, wherein the degradation rate comparing unit compares the present degradation rate with the previous degradation rate and overwrites the previous degradation rate in the degradation rate storage unit with the present degradation rate when the present degradation rate is smaller than the previous degradation rate by the predetermined value.

(8) The lithium ion battery control system, wherein the degradation rate calculating unit calculates the degradation rate after the charging and discharging condition is changed, and wherein the degradation rate comparing unit compares the degradation rate after the charging and discharging condition is changed with the previous degradation rate stored in the degradation rate storage unit and that sends a signal for changing a charging and discharging condition other than the changed charging and discharging condition to the charging and discharging control circuit when the degradation rate after the charging and discharging condition is changed is greater than the previous degradation rate stored in the degradation rate storage unit by a predetermined value.

(9) An assembled battery control system controlling charging and discharging of an assembled battery, including: an assembled battery in which a plurality of lithium ion batteries are connected in series; a plurality of serial circuits that include a resistor and a balancing switch for causing a discharging current to flow independently in each of the plurality of lithium ion batteries; a control circuit that controls the balancing switches; an assembled battery calculation processing unit that controls charging and discharging of the assembled battery; a degradation rate storage unit that stores previous degradation rates of the lithium ion batteries; a degradation rate calculating unit that calculates present degradation rates of the lithium ion batteries; and a degradation rate comparing unit that compares the present degradation rates with the previous degradation rates and that sends a signal for restricting a charging and discharging condition of the assembled battery or the lithium ion batteries when the present degradation rates are greater than the previous degradation rates by a predetermined value.

(10) The assembled battery control system, wherein degradation rates before and after charging and discharging the lithium ion batteries by a predetermined capacity are used as the present degradation rates.

(11) The assembled battery control system, wherein the charging and discharging condition to be changed includes lowering an upper-limit charging current.

(12) The assembled battery control system, wherein the charging and discharging condition to be changed includes lowering an upper-limit discharging current.

(13) The assembled battery control system, wherein the charging and discharging condition to be changed includes lowering an upper-limit charging voltage.

(14) The assembled battery control system, wherein the charging and discharging condition to be changed includes raising a lower-limit discharging voltage.

(15) The assembled battery control system, wherein the degradation rate comparing unit has a function of comparing the present degradation rates with the previous degradation rates and overwriting the previous degradation rates in the degradation rate storage unit with the present degradation rates when the present degradation rates are smaller than the previous degradation rates by the predetermined value.

(16) The assembled battery control system, wherein the degradation rate comparing unit independently discharges the lithium ion batteries by a predetermined capacity when the present degradation rates of the lithium ion batteries are greater than the previous degradation rates by a predetermined value.

According to the invention, it is possible to provide a lithium ion battery control system which can enable improvement of cycle characteristics of a lithium ion battery. Other objects, configurations, and advantages will become apparent from the following description of embodiments.

DETAILED DESCRIPTION OF THE INVENTION

Figure 1:
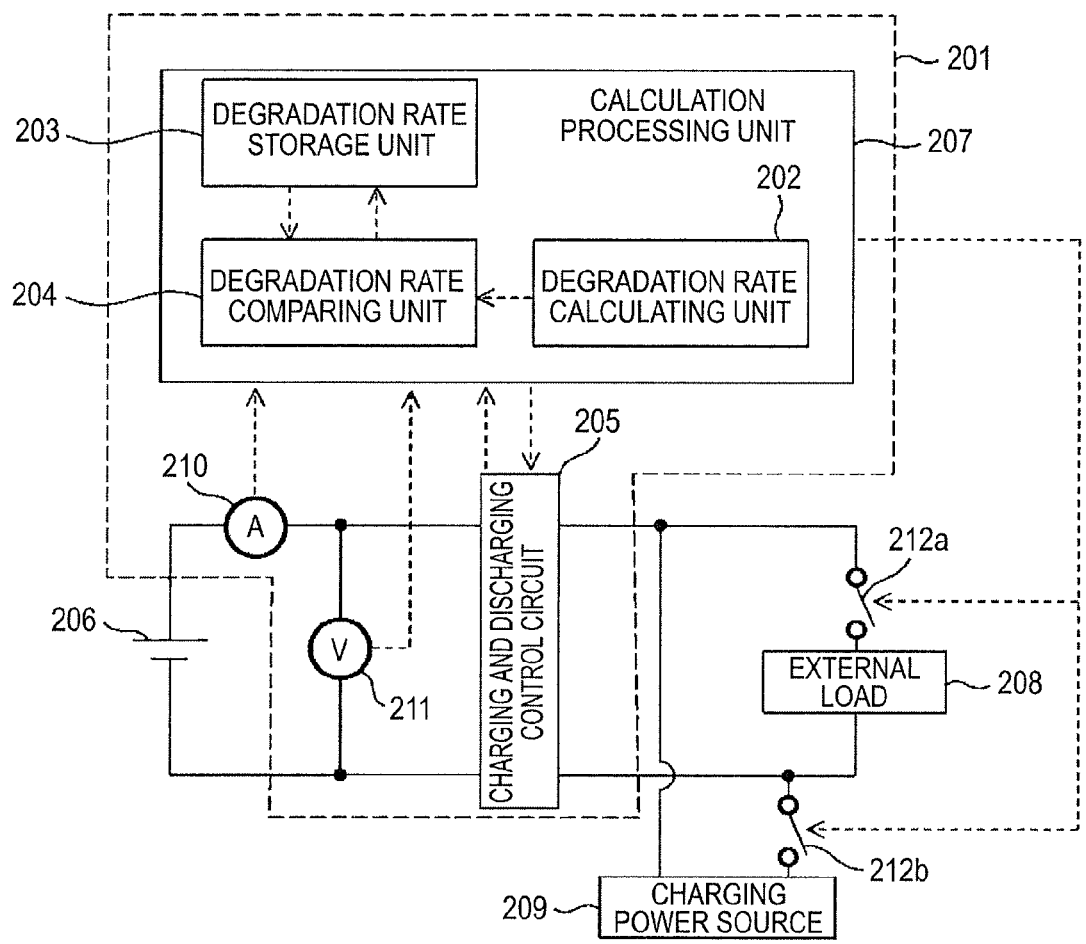
FIG. 1 is a circuit diagram illustrating the configuration of a lithium ion battery control system according to an embodiment of the invention.

Hereinafter, an embodiment of the invention (hereinafter, appropriately referred to as "this embodiment") will be described in detail, but this embodiment is not limited to the following description and can be modified in various forms without departing from the concept of the invention.
Configuration of Lithium Ion Battery Control System according to This Embodiment A lithium ion battery control system according to this embodiment serves to control charging and discharging of a lithium ion battery having a positive electrode and a negative electrode. FIG. 1 is a circuit diagram illustrating the configuration of a lithium ion battery control system according to this embodiment. As shown in FIG. 1, the lithium ion battery control system 201 according to this embodiment includes a degradation rate calculating unit 202, a degradation rate storage unit 203, a degradation rate comparing unit 204, and a charging and discharging control circuit 205.

FIG. 1 shows a lithium ion battery (battery) 206 to which the lithium ion battery control system 201 according to this embodiment is applied, a calculation processing unit 207 processing various calculations in the lithium ion battery control system 201 according to this embodiment, an external load 208, a charging power source 209, a current measuring unit 210, a voltage measuring unit 211, and switches 212a and 212b, in addition to the lithium ion battery control system 201 according to this embodiment. The battery 206 is connected to the external load 208 via the switch 212a and is connected to the charging power source 209 charging the battery 206 via the switch 212b. In this embodiment, the degradation rate calculating unit 202, the degradation rate storage unit 203, and the degradation rate comparing unit 204 are disposed in the calculation processing unit 207.

The degradation rate calculating unit 202 calculates a present progressing rate ($\Delta SOH_1$) of a degraded state (SOH) of the battery 206.

The SOH is a value representing the degraded state of the battery 206. When the battery 206 degrades, changes in characteristics are caused such as an increase in internal resistance or a decrease in capacity at the time of being fully charged. In general, the SOH is calculated from the characteristics changed due to the degradation or the ratio of the changed characteristics to the initial characteristics. The calculated SOH may be reflected in other calculations to detect the state of the battery 206 in consideration of the degradation information or may be used as an indicator for determining the lifetime of the battery 206. In this embodiment, it is defined that as the degradation of the battery 206 progresses, the value of the SOH increases. Examples of the value representing the degraded state include a variation in DC resistance, a capacity variation in a range in which a certain output can be achieved, and potential ranges of a positive electrode and a negative electrode.

$\Delta SOH_1$ is a value representing the present progressing rate of the SOH of the battery 206. $\Delta SOH_1$ is expressed by Expression 1.

$$\Delta SOH_1 = SOH_1 - SOH_0 \quad (1)$$

Here, $SOH_1$ represents the present degraded state of the battery 206 and $SOH_0$ represents the previous degraded state of the battery 206 (details of which will be described later).

The degradation rate storage unit 203 stores the previous degradation rate ($\Delta SOH_0$) of the battery 206. $\Delta SOH_0$ represents the previous $\Delta SOH_1$ of the battery and is calculated through the use of Expression 1.

The degradation rate comparing unit 204 is a unit comparing the present progressing rate $\Delta SOH_1$ of the SOH of the battery 206 with $\Delta SOH_0$ and sending a signal for changing a charging and discharging condition to the charging and discharging control circuit 205 or the calculation processing unit 207 when a predetermined condition is satisfied (details of which will be described later).

State detecting means may be provided particularly and the temperature of the battery 206 may be input to detect the state thereof. In this case, the battery 206 is provided with temperature measuring means such as a thermistor or a thermoelectric couple, which is not shown in FIG. 1.

The charging and discharging control circuit 205 controls the charging and discharging of the battery 206 on the basis of a command from the calculation processing unit 207. When the charging and discharging of the discharged battery 206 is performed, the charging and discharging control circuit 205 charges and discharges the battery 206 until the battery voltage of the battery 206 after the charging and discharging is started reaches a predetermined charging cutoff voltage. The charging and discharging cutoff voltage is set in advance, but the charging and discharging cutoff voltage may be changed by the degradation rate comparing unit 204 as described later. When the charging and discharging cutoff voltage is changed, the charging and discharging control circuit 205 performs the charging and discharging operation on the basis of the new charging and discharging cutoff voltage.

The information on the current and the battery voltage of the battery 206 measured by the current measuring unit 210 and the voltage measuring unit 211 is input to the calculation processing unit 207. The calculation processing unit 207 is a controller, a computer system, or a micro-computer including a storage unit and a CPU and other means may be used as long as they can receive information, perform calculation, and output the calculation result. The degradation rate calculating unit 202, the degradation rate storage unit 203, the degradation rate comparing unit 204, the voltage measuring unit 211, and the current measuring unit 210 may be embodied on independent substrates or may be embodied in the same device to constitute a micro-computer.

The calculation processing unit 207 independently measures and integrates the battery voltage, the current, the charging time, the down time (standby time), and the unused time of the battery 206 and performs calculating operations and processes including the calculation of the SOH of the battery 206. The calculation processing unit 207 controls the charging of the battery 206 through the use of the charging and discharging control circuit 205 by determining charging and discharging control parameters (such as discharging or charging time, discharging or charging voltage, and discharging or charging current) of the battery 206 on the basis of result of the calculating operations and processes and transmitting the charging and discharging control parameters to the charging and discharging control circuit 205.

At the time of discharging, the calculation processing unit 207 transmits the control parameters causing the discharging voltage and the discharging current of the battery 206 to have desired values to the charging and discharging control circuit 205 and transmits a signal for closing the switch 212*a* and a signal for opening the switch 212*b* to the switches 212*a* and 212*b*. As a result, the battery 206 and the external load 208 are electrically connected to enable the discharging of the battery 206.

On the contrary, at the time of charging, the calculation processing unit 207 transmits the control parameters causing the charging voltage and the charging current to have desired values to the charging and discharging control circuit 205 and transmits a signal for opening the switch 212*a* and a signal for closing the switch 212*b* to the switches 212*a* and 212*b*. As a result, the battery 206 and the charging power source 209 are electrically connected to enable the charging of the battery 206.

For example, to measure the temperature of the battery 206, temperature measuring means (not shown) such as a thermoelectric couple and a thermistor may be provided. By providing this means and causing the calculation processing unit 207 to acquire the temperature measured by the means, it is possible to control the discharging of the battery 206 depending on the temperature, thereby more accurately controlling the discharging.

A storage unit (not shown) storing various measured information may be provided. The specific configuration of the storage unit is not particularly limited, and magnetic recording media such as a floppy (registered trademark) disk (FD) and a hard disk drive (HDD), semiconductor media such as a random access memory (RAM) and a flash memory (USB memory), and optical recording media such as a compact disc (such as a CD-R or a CD-RW), a digital versatile disc (such as a DVD-R, a DVD+R, a DVD+RW, a DVD-RW, or a DVD-RAM), an HD-DVD, and a Blu-ray Disc can be used.

The battery 206 is an object to which the lithium ion battery control system 201 according to this embodiment is applied, and includes a positive electrode and a negative electrode. The specific configuration of the battery 206 is not particularly limited, and, for example, a battery described below in the Configuration of Battery can be used.

The battery 206 may be a single battery including only one battery or an assembled battery in which two or more batteries are combined in series and in parallel.

In the assembled battery, it is preferable that a cell controller be provided to each single battery. The cell controller is an electronic circuit device managing the single batteries and has an exemplary configuration in which cell-managing integrated circuit elements provided to correspond to the signal batteries, circuit elements changing the states of charge of the respective single batteries, circuits detecting the voltages of the respective single batteries, insulating elements such as a photo-coupler, circuit elements constituting a noise removing circuit, and circuit elements constituting a protective circuit are mounted on a circuit board.

Charging and Discharging Control Method in Lithium Ion Battery Control System

A discharging control method in the lithium ion battery control system according to this embodiment will be described with reference to the flowchart shown in FIG. 2.

Figure 2:
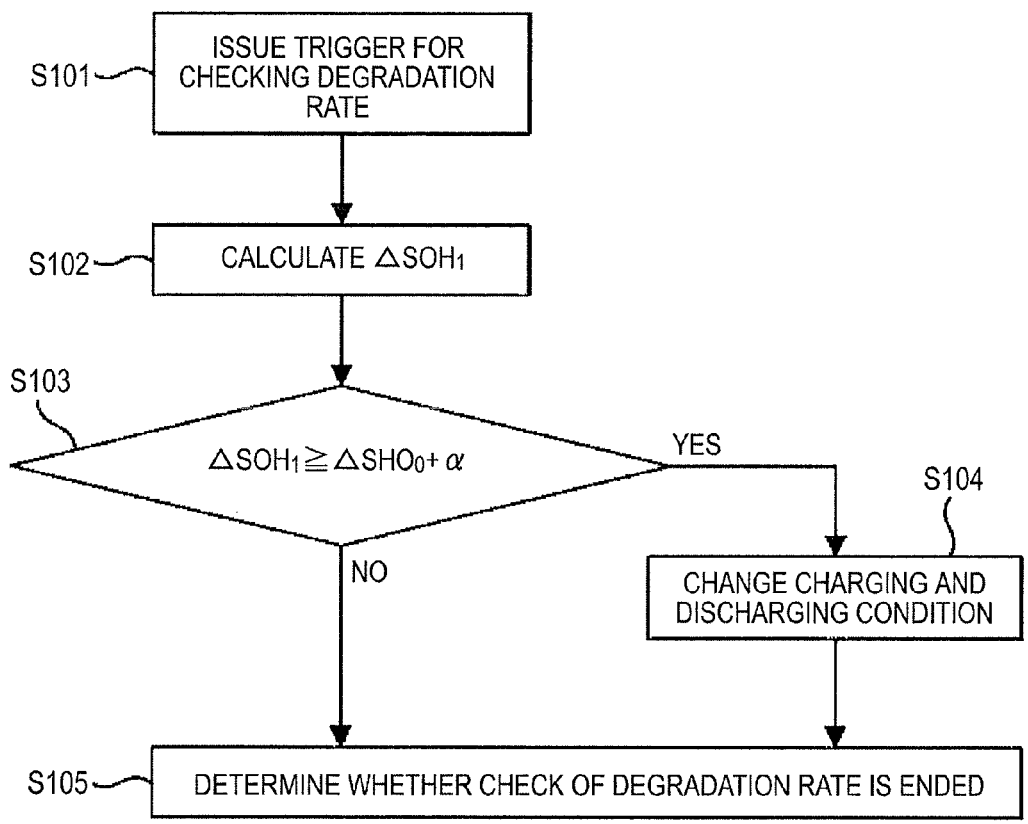
FIG. 2 is a flowchart illustrating a discharging control method in a lithium ion battery control system according to a first embodiment of the invention.

The flow of processes shown in FIG. 2 is performed by the calculation processing unit 207 and the degradation rate calculating unit 202, the degradation rate storage unit 203, and the degradation rate comparing unit 204 in the calculation processing unit 207.

In step S101, a trigger for starting the check of the degradation rate of the battery 206 is received by the degradation rate calculating unit 202. When it is determined that the trigger is received by the degradation rate calculating unit 202, the flow of processes goes to step S102.

The time of outputting the trigger is not particularly limited, but the trigger can be output at arbitrary times such as the time of reaching the charging cutoff voltage a predetermined number of times, the time of reaching the discharging cutoff voltage a predetermined number of times, the time when a predetermined time passes, the time of exceeding a predetermined capacity, and the time of consuming a predetermined amount of power. The time of outputting the trigger is preferably set in consideration of the designed lifetime of the battery, the materials of the positive and negative electrodes, and the use of the battery. When the interval of the triggers is great, the degradation may progress to reduce the degradation suppressing effect. When the interval of the triggers is small, an erroneous operation may be caused.

In step S102, the degradation rate calculating unit 202 calculates $\Delta SOH_1$ and the flow of processes goes to step S103.

In step S103, the degradation rate comparing unit 204 receives the information of $\Delta SOH_1$ from the degradation rate calculating unit 202 and the information of $\Delta SOH_0$ from the degradation rate storage unit 203 and compares $\Delta SOH_1$ with $\Delta SOH_0$. As a result, when the measured $\Delta SOH_1$ is less than the sum of $\Delta SOH_0$ and a preset management value $\alpha$ (that is, $\Delta SOH_1 < \Delta SOH_0 + \alpha$) (No in step S103), the degradation rate comparing unit 204 determines whether the check of the degradation rate should be ended (step S105), and the check of the degradation rate is ended.

$\alpha$ is a management value for preventing an erroneous operation at the time of checking the degradation rate. The value of $\alpha$ is not particularly limited, but the value of $\alpha$ is preferably set in consideration of the designed lifetime of the battery, the materials of the positive and negative electrodes, and the use of the battery. When the value of $\alpha$ is great, the degradation may progress to reduce the degradation suppressing effect. When the value of $\alpha$ is small, an erroneous operation may be caused.

On the other hand, when $\Delta SOH_1 \geq \Delta SOH_0 + \alpha$ is determined in step S103, the flow of processes goes to step S104. In step S104, a charging and discharging condition is changed and the determination on whether the check is ended is performed.

The charging and discharging condition to be changed is not particularly limited as long as it is a charging and discharging condition which can be expected to suppress the degradation. Examples thereof include lowering the charging cutoff voltage, raising the discharging cutoff voltage, and lowering the charging and discharging current. The charging and discharging condition to be changed is preferably set in consideration of the designed lifetime of the battery, the materials of the positive and negative electrodes, and the use of the battery. It is preferable that the battery lifetime at the time of changing the charging and discharging condition be checked in advance and a charging and discharging condition which has a small influence on the use of the battery and has a great effect be set.

Examples of the charging and discharging condition to be changed include lowering an upper-limit charging current, lowering an upper-limit discharging current, lowering an upper-limit charging voltage, and raising a lower-limit discharging voltage. The condition having a great influence on the degradation rate varies depending on the system of the battery. The above-described have a possibility of affecting the degradation rate and can be easily changed, which is preferable.

The method of lowering the upper-limit charging current can be easily applied to a PHEV or the like which is continuously charged in the nighttime. The method of lowering the upper-limit discharging current can be easily applied to the consumer use. The method of lowering the upper-limit charging voltage can be easily applied under conditions where it is difficult to achieve the same capacity as an HEV. The method of raising the lower-limit discharging voltage can be easily applied under conditions where it is difficult to achieve the same capacity as an HEV.

Figure 3:
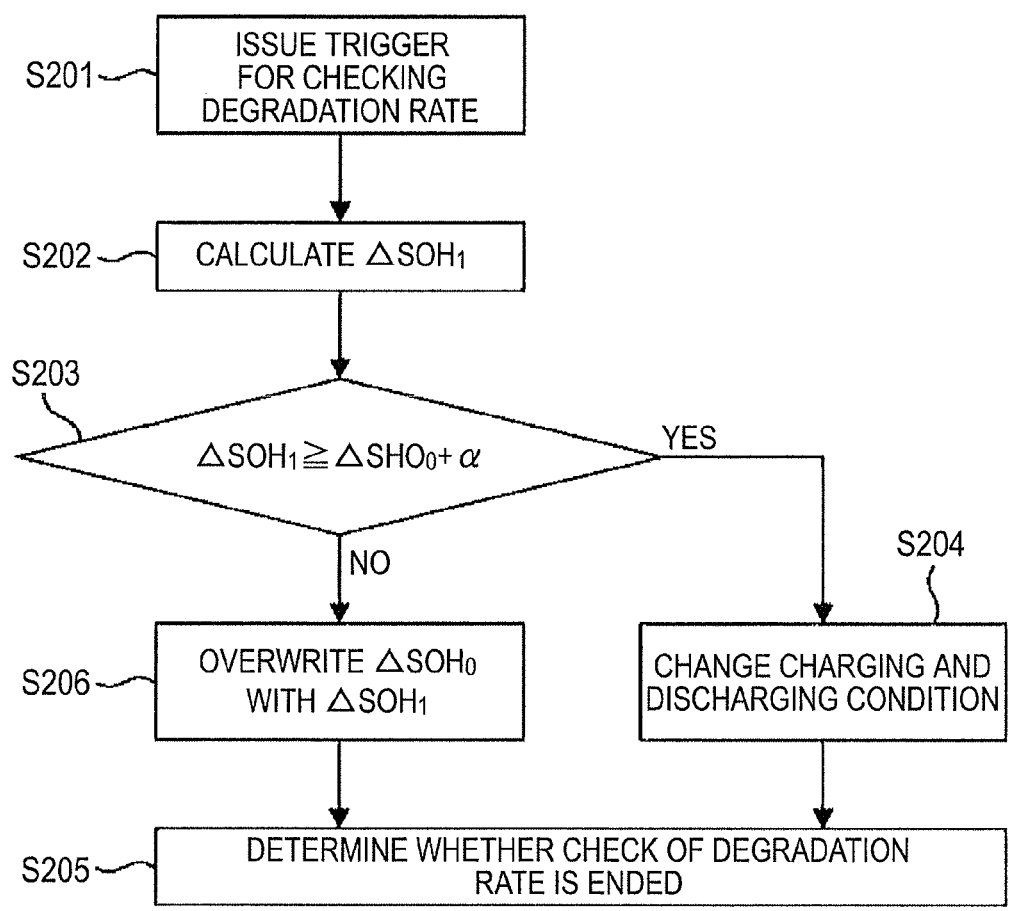
FIG. 3 is a flowchart illustrating a discharging control method in a lithium ion battery control system according to a second embodiment of the invention.

FIG. 3 is a flowchart illustrating a discharging control method in a lithium ion battery control system according to a second embodiment of the invention. Steps S201 to S202 and steps S204 to S205 in FIG. 3 are the same as steps S101 to S102 and steps S104 to S105 in FIG. 2 and thus description thereof is not repeated.

In the embodiment shown in FIG. 3, similarly to the first embodiment shown in FIG. 2, in step S203, the degradation rate comparing unit 204 receives information of $\Delta SOH_1$ from the degradation rate calculating unit 202 and information of $\Delta SOH_0$ from the degradation rate storage unit 203 and compares $\Delta SOH_1$ with $\Delta SOH_0$. When $\Delta SOH_1 \geq \Delta SOH_0 + \alpha$ is determined, the flow of processes goes to step S204. In step S204, the charging and discharging conditions are changed and the determination on whether the check is ended is performed.

On the other hand, when the measured $\Delta SOH_1$ is less than the sum of $\Delta SOH_0$ and a preset management value $\alpha$ (that is, $\Delta SOH_1 < \Delta SOH_0 + \alpha$) (No in step S203), $\Delta SOH_0$ in the degradation rate storage unit 203 is overwritten with $\Delta SOH_1$, it is determined whether the check of the degradation rate should be ended (step S206), and the check of the degradation rate is ended.

In a lithium ion battery, the degradation rate may vary as the degradation progresses. In the second embodiment in which $\Delta SOH_0$ is appropriately updated, it is possible to cope with the variation in the degradation rate. On the other hand, when the interval of the triggers for starting the check of the degradation rate is small, it may not be possible to cope with the increase in the degradation rate, which is considerable.

Figure 4:
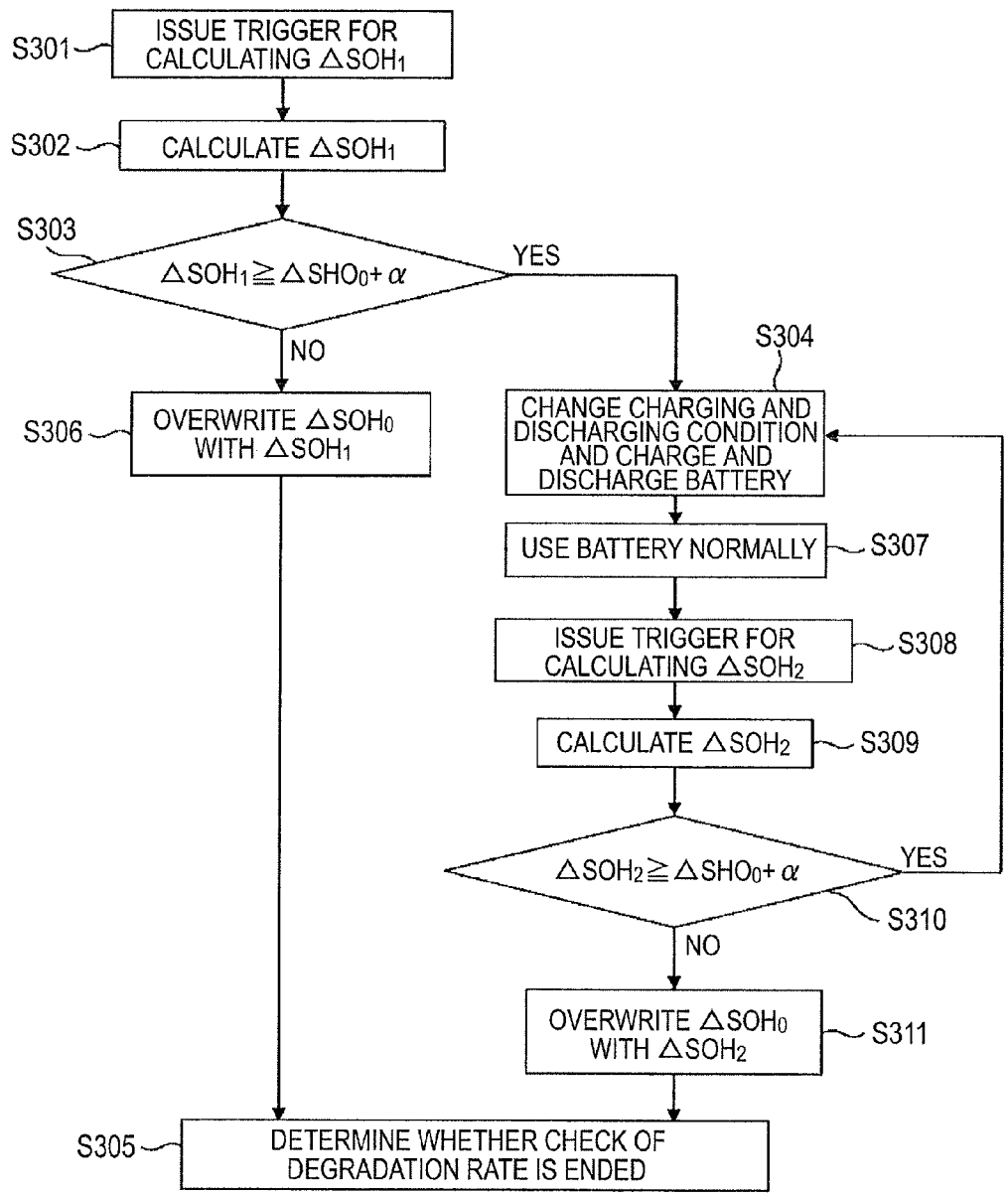
FIG. 4 is a flowchart illustrating a discharging control method in a lithium ion battery control system according to a third embodiment of the invention.

FIG. 4 is a flowchart illustrating a discharging control method in a lithium ion battery control system according to a third embodiment of the invention. Steps S301 to S303 and steps S305 to S306 in FIG. 4 are the same as steps S201 to S203 and steps S205 to s206 in FIG. 3 and thus description thereof is not repeated.

In the embodiment shown in FIG. 4, similarly to the second embodiment shown in FIG. 3, when $\Delta SOH_1 \geq \Delta SOH_0 + \alpha$ is determined in step S303, the flow of processes goes to step S304. In step S304, the charging and discharging conditions are changed and the flow of processes goes to step S307.

In step S307, the battery is normally used under the changed charging and discharging conditions.

In step S308, a trigger for starting the check of the degradation rate of the battery 206 is received by the degradation rate calculating unit 202. When it is determined that the trigger is received by the degradation rate calculating unit 202, the flow of processes goes to step S309.

The time of outputting the trigger is not particularly limited, but the trigger can be output at arbitrary times such as the time of reaching the charging cutoff voltage a predetermined number of times, the time of reaching the discharging cutoff voltage a predetermined number of times, the time when a predetermined time passes, the time of exceeding a predetermined capacity, and the time of consuming a predetermined amount of power. The time of outputting the trigger is preferably set in consideration of the designed lifetime of the battery, the materials of the positive and negative electrodes, and the use of the battery. When the interval of the triggers is great, the degradation may progress to reduce the degradation suppressing effect. When the interval of the triggers is small, an erroneous operation may be caused. The same time as in step S301 may be used as the time of outputting the trigger.

In step S309, the degradation rate calculating unit 202 calculates $\Delta SOH_2$ and the flow of processes goes to step S310.

$\Delta SOH_2$ is a value representing the progressing rate of the SOH of the battery 206 after the charging and discharging conditions are changed. $\Delta SOH_2$ is expressed by Expression 2.

$$\Delta SOH_2 = SOH_2 - SOH_1 \quad (2)$$

Here, $SOH_1$ represents the degraded state of the battery 206 in step S301 and $SOH_2$ represents the degraded state of the battery 206 in step S309 (details of which will be described later).

In step S310, the degradation rate comparing unit 204 receives the information of $\Delta SOH_2$ from the degradation rate calculating unit 202 and the information of $\Delta SOH_0$ from the degradation rate storage unit 203 and compares $\Delta SOH_2$ with $\Delta SOH_0$.

When $\Delta SOH_2 \geq \Delta SOH_0 + \alpha$ is determined, the flow of processes goes to step S304. In step S304, the charging and discharging condition is changed to another charging and discharging condition and the flow of processes goes again to step S307.

On the other hand, when the measured $\Delta SOH_2$ is less than the sum of $\Delta SOH_0$ and a preset management value $\alpha$ (that is, $\Delta SOH_2 < \Delta SOH_0 + \alpha$) (No in step S310), the flow of processes goes to step S311. In step S311, $\Delta SOH_0$ in the degradation rate storage unit 203 is overwritten with $\Delta SOH_2$, it is determined whether the check of the degradation rate should be ended (step S305), and the check of the degradation rate is ended.

In the third embodiment, when the degradation rate leads, it is possible to select plural charging and discharging conditions to be changed or to gradually alleviate the charging and discharging conditions. Compared with the first embodiment and the second embodiment, the third embodiment can be easily applied to cases where the method of alleviating the degradation rate of a battery is not clear or there are plural methods of alleviating the degradation rate.

As described above with reference to FIGS. 2, 3, and 4, since the lithium ion battery control system 201 according to this embodiment has the above-mentioned configuration and the units, thereof operate as described above, it is possible to provide a lithium ion battery control system with improved cycle characteristics which can suppress an increase in internal resistance of the lithium ion battery and suppress a decrease in discharge capacity.

As described above, the battery 206 may be an assembled battery in which plural single batteries are connected. The assembled battery can employ the method described in the Charging and Discharging Control Method in Lithium Ion Battery Control System.

In an assembled battery in which single batteries are connected in series, the invention may suppress degradation deviations of the single batteries in the assembled battery.

In the assembled battery in which single batteries are connected in series, the rechargeable capacity and the charging and discharging current need to be controlled with reference to a single battery having the largest $\Delta SOH$. Accordingly, in the control method according to the related art, when a single battery with $\Delta SOH$ larger than those of the other batteries is present in the single batteries, the $\Delta SOH$ becomes $\Delta SOH$ of the assembled battery.

However, in the invention, when the $\Delta SOH$ can be lowered by changing the charging and discharging conditions, it is possible to suppress the degradation deviations of the single batteries in the assembled battery and thus to lower $\Delta SOH$ of the assembled battery.

The charging and discharging conditions to be changed for suppressing the deviations of the single batteries in the assembled battery are not particularly limited as long as they are charging and discharging conditions which can provide the suppression of degradation, but a method of lowering the charging cutoff voltage of the single battery with large $\Delta SOH$ is particularly preferable. By discharging only the single battery with large $\Delta SOH$ in advance, this method can be embodied.

After this operation is performed, the voltage of the assembled battery may not be changed. By performing this operation, it is possible to suppress the deviations of the single batteries without lowering the performance of the battery.

In this case, the single batteries other than the single battery with large $\Delta SOH$ may slightly increase in battery voltage in comparison with that before changing the charging and discharging conditions, and thus may increase in $\Delta SOH$. However, as described above, since the $\Delta SOH$ of the assembled battery in which single batteries are connected in series is based on the single battery with the largest $\Delta SOH$, it is possible to suppress the degradation.

Configuration of Lithium Ion Battery

The lithium ion battery control system according to this embodiment can be applied to a known lithium ion battery. An example of the lithium ion battery will be described below with reference to FIG. 5. The configuration described below is only an example and the lithium ion battery to which the lithium ion battery control system according to this embodiment may be applied is not limited to the structure shown in FIG. 5.

Figure 5:
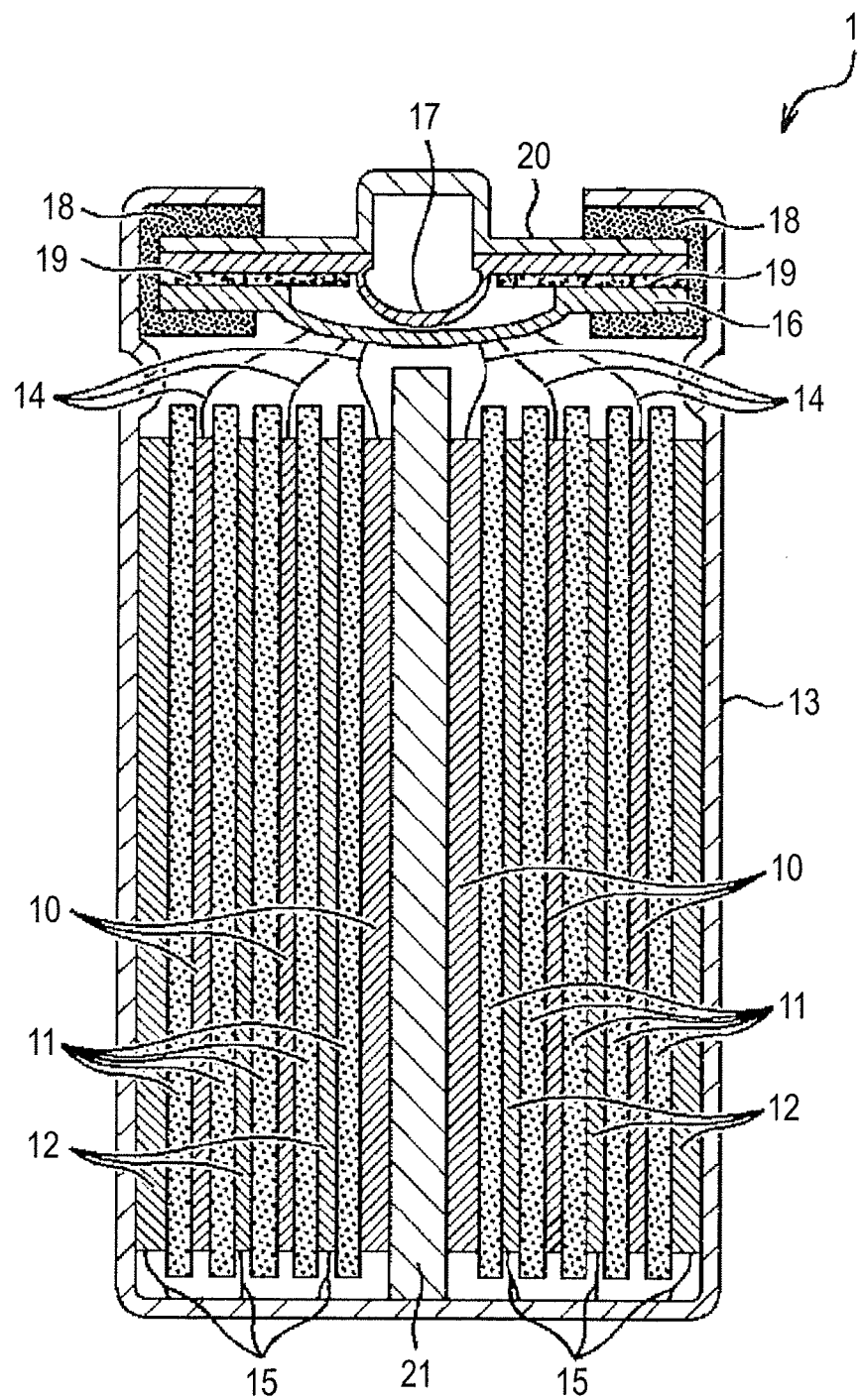
FIG. 5 is a diagram schematically illustrating an example of an internal structure of a battery to which the lithium ion battery control system according to the embodiment of the invention can be applied.

FIG. 5 is a diagram schematically illustrating the internal structure of a lithium ion battery. The battery 206 according to this embodiment shown in FIG. 5 includes a positive electrode 10, a separator 11, a negative electrode 12, a battery vessel (that is, battery can) 13, a positive-electrode collector tab 14, a negative-electrode collector tab 15, an inner lid 16, an internal pressure open valve 17, a gasket 18, a positive temperature coefficient (PTC) resistive element 19, a battery lid 20, and a shaft core 21. The battery lid 20 is an integrated part including the inner lid 16, the internal pressure open valve 17, the gasket 18, and the PTC resistive element 19. The positive electrode 10, the separator 11, and the negative electrode 12 are wound on the shaft core 21.

The positive electrode 10 includes a positive-electrode active material, a conducting agent, a binder, and a collector. Representative examples of the positive-electrode active material include $LiCoO_2$, $LiNiO_2$, and $LiMn_2O_4$. Other examples thereof include $LiMnO_3$, $LiMn_2O_3$, $LiMnO_2$, $Li_4Mn_5O_{12}$, $LiMn_{2-x}M_xO_2$ (where M is at least one selected from the group consisting of Co, Ni, Fe, Cr, Zn, and Ti and x is in the range of 0.01 to 0.2), $Li_2Mn_3MO_8$ (where M is at least one selected from the group consisting of Fe, Co, Ni, Cu, and Zn), $Li_{1-x}A_xMn_2O_4$ (where A is at least one selected from the group consisting of Mg, B, Al, Fe, Co, Ni, Cr, Zn, and Ca and x is in the range of 0.01 to 0.1), $LiNi_{1-x}M_xO_2$ (where M is at least one selected from the group consisting of Co, Fe, and Ga and x is in the range of 0.01 to 0.2), $LiFeO_2$, $Fe_2(SO_4)_3$, $LiCo_{1-x}M_xO_2$ (where M is at least one selected from the group consisting of Ni, Fe, and Mn and x is in the range of 0.01 to 0.2), $LiNi_{1-x}M_xO_2$ (where M is at least one selected from the group consisting of Mn, Fe, Co, Al, Ga, Ca, and Mg and x is in the range of 0.01 to 0.2), Fe $(MoO_4)_3$, $FeF_3$, $LiFePO_4$, and $LiMnPO_4$.

The particle diameter of the positive-electrode active material is typically defined to be equal to or less than the thickness of a mixture layer including the positive-electrode active material, the conducting agent, and the binder. When coarse grains having a size larger than the thickness of the mixture layer are present in the powder of the positive-electrode active material, it is preferable that the coarse grains be removed through sieve classification, wind flow classification, or the like to produce particles with a size smaller than the thickness of the mixture layer.

Since the positive-electrode active material is typically an oxide and thus has high electrical resistance, a conducting agent formed of carbon powder for compensating for the electrical conductivity is used. Since the positive-electrode active material and the conducting agent are normally powder, a binder can be mixed into the powder to couple the powder and to attach the coupled powder to the collector.

An aluminum foil with a thickness of 10 to 100 µm, an aluminum punched foil with a thickness of 10 to 100 µm and with a hole diameter of 0.1 to 10 mm, an expanded metal, a foamed metal plate, or the like can be used as the collector of the positive electrode 10. A material such as stainless steel or titanium can be used in addition to aluminum. In the invention, any collector can be used without depending on the material, the shape, the manufacturing method, and the like.

A positive-electrode slurry in which the positive-electrode active material, the conducting agent, the binder, and an organic solvent are mixed is applied to a collector through the use of a doctor blade method, a dipping method, a spray method, or the like, the organic solvent is dried, and the resultant is pressed by the use of a roll press, whereby a positive electrode 10 can be manufactured. By performing the processes from application to drying plural times, plural mixture layers may be stacked on the collector.

The negative electrode 12 includes a negative-electrode active material, a binder, and a collector. When high-rate charging and discharging is required, a conducting agent may be added thereto. Examples of the negative-electrode active material which can be used in the invention include graphite, non-graphite carbon, metals such as aluminum, silicon, and tin, alloys thereof, lithium-containing transition metal nitride $Li_{(3-x)}M_xN$, lower oxides of silicon $Li_xSiO_y$ (where 0≤x and 0<y<2), and materials forming an alloy with lithium tin lower oxides $Li_xSnO_y$, or materials forming an intermetallic compound therewith.

The material of the negative-electrode active material is not particularly limited and materials except the above-mentioned materials can be used. However, when some materials such as materials which expand and contract easily are selected and the use range of the negative electrode is excessively great, the increase in resistance may be excessive. In this case, it is preferable that it be checked whether the potential of the negative electrode is equal to or less than a predetermined value, in addition to the condition of changing the battery voltage.

The negative-electrode active material preferably includes graphite and the distance ($d_{002}$) between graphite layers is preferably in the range of 0.335 nm to 0.338 nm. Since the negative electrode 12 includes such graphite and thus the potential curve of graphite has a stage structure, it is possible to further improve the cycle characteristics of the lithium ion battery. The graphite used in the negative electrode 12 is produced using natural graphite, synthetic graphite, mesophase carbon, expanded carbon, carbon fiber, vapor-growth carbon fiber, pitch-based carbon material, needle coke, petroleum coke, and polyacrylonitrile carbon fiber, which can chemically absorb and release lithium ions as raw materials. The distance ($d_{002}$) between graphite layers can be measured through the use of an XRD (X-Ray Diffraction method) or the like.

The non-graphite carbon used in the negative electrode 12 is a carbon material other than the above-mentioned graphite and can absorb and release lithium ions. Examples thereof include carbon materials which have a distance between the graphite layers of equal to or greater than 0.34 nm and which are changed to graphite through a high-temperature heating process of 2000° C. or higher, five-membered or six-membered cyclic hydrocarbons, or amorphous carbon materials synthesized from cyclic oxygen-containing organic compounds through pyrolysis.

A material forming an alloy with lithium or a material forming an intermetallic compound therewith may be added as a third negative-electrode active material to the negative electrode 12 having a voltage change rate different from the positive electrode 10. Examples of the third negative-electrode active material include metals such as aluminum, silicon, and tin, alloys thereof, lithium-containing transition metal nitride $Li_{(3-x)}M_xN$, lower oxides of silicon $Li_xSiO_y$ (where and 0≤y and 0<y<2), and lower oxides of tin $Li_xSnO_y$. The material of the third negative-electrode active material is not particularly limited and materials other than the above-mentioned materials can be used.

Since the negative-electrode active material is normally powder, a binder can be mixed into the powder to couple the powder and to attach the coupled powder to the collector. In the negative electrode 12 of the battery 206 according to this embodiment, it is preferable that the particle diameter of the negative-electrode active material be set to be equal to or less than the thickness of the mixture layer including the negative-electrode active material and the binder. When coarse grains having a size larger than the thickness of the mixture layer are present in the powder of the negative-electrode active material, it is preferable that the coarse grains be removed in advance through sieve classification, wind flow classification, or the like to produce particles with a size smaller than the thickness of the mixture layer.

A copper foil with a thickness of 10 to 100 µm, a copper punched foil with a thickness of 10 to 100 µm and with a hole diameter of 0.1 to 10 mm, an expanded metal, a foamed metal plate, or the like can be used as the collector of the negative electrode 12. A material such as stainless steel, titanium, or nickel can be used in addition to copper. In the invention, any collector can be used without depending on the material, the shape, the manufacturing method, and the like.

A negative-electrode slurry in which the negative-electrode active material, the binder, and an organic solvent are mixed is applied to a collector through the use of a doctor blade method, a dipping method, a spray method, or the like, the organic solvent is dried, and the resultant is pressed by the use of a roll press, whereby a negative electrode 12 can be manufactured. By performing the processes from application to drying plural times, plural mixture layers may be stacked on the collector.

It is preferable that the amounts of the active materials of the positive electrode 10 and the negative electrode 12 applied be designed to be around the negative electrode potential α and to be slightly lower than the positive electrode potential γ at the charging cutoff voltage $V_0$. Specifically, the rate of utilization of the positive electrode is preferably in the range of 70% to 98% with respect to the positive electrode potential γ, the rate of utilization of the positive electrode is more preferably in the range of 75% to 95%, and the rate of utilization of the positive electrode is still more preferably in the range of 80% to 90%.

The positive-electrode active material of the positive electrode 10 preferably includes lithium composite oxide expressed by Formula 3 from the viewpoint of easy measurement of the potential and more preferably includes $LiNi_{1/3}Mn_{1/3}Co_{1/3}O_2$.

$$LiNi_aMn_bCo_cM_dO_2 \quad (3)$$

In Formula 3, M represents at least one selected from the group consisting of Fe, V, Ti, Cu, Al, Sn, Zn, Mg, B, and W and a, b, c, and d are values satisfying $0.2 \leq a \leq 0.8$, $0.1 \leq b \leq 0.4$, $0 \leq c \leq 0.4$, and $0 \leq d \leq 0.1$, respectively, and satisfying $a+b+c+d=1$. In the examples, characters such as "M" and "x" repeatedly appearing in the examples are independent of each other in the examples. The same is true of the following description, as long as they are not particularly designated.

The separator 11 is interposed between the positive electrode 10 and the negative electrode 12 manufactured through the use of the above-mentioned method to prevent the short-circuit of the positive electrode 10 and the negative electrode 12. A polyolefin-based polymer sheet formed of polyethylene, polypropylene, or the like or a two-layered structure in which a polyolefin-based polymer and a fluorine-based polymer sheet such as polytetrafluoroethylene are welded can be used as the separator 11. A mixture of ceramic and a binder may be formed in a thin film shape on the surface of the separator 11 so that the separator 11 does not contract when the battery temperature is raised. Since the separator 11 needs to transmit lithium ions at the time of charging and discharging the battery, the separator 11 which can be used for a lithium ion battery preferably has a micro pore diameter of 0.01 to 10 μm and a porosity of 20% to 90%.

Such a separator 11 is interposed between the positive electrode 10 and the negative electrode 12 and the resultant is wound on the shaft core 21 to form an electrode group. The shaft core 21 can employ any known core as long as it can immerse the positive electrode 10, the separator 11, and the negative electrode 12. The electrode group may have various shapes such as a shape in which a strip-like electrode is stacked or a shape in which the positive electrode 10 and the negative electrode 12 are wound in any shape such as a flat shape, in addition to the cylindrical shape shown in FIG. 5. The shape of the battery vessel 13 may be selected from a cylindrical shape, a flat elliptical shape, an oblate elliptical shape, and polygonal shapes depending on the shape of the electrode group.

The material of the battery vessel 13 is selected from materials such as aluminum, stainless steel, and nickel-plated steel having corrosion resistance to a non-aqueous electrolyte. When the battery vessel 13 is electrically connected to the positive electrode 10 or the negative electrode 12, the material of the battery vessel 13 is selected so that the material is not denatured due to the corrosion of the battery vessel 13 or the alloying with lithium ions in the part in contact with the non-aqueous electrolyte.

The electrode group is received in the battery vessel 13, the negative-electrode collector tab 15 is connected to the inner wall of the battery vessel 13, and the positive-electrode collector tab 14 is connected to the bottom of the battery lid 20. The electrolytic solution is injected into the battery vessel 13 before sealing the battery. Examples of the method of injecting the electrolytic solution into the battery vessel include a method of directly adding the electrolytic solution to the electrode group in the state where the battery lid 20 is opened and a method of adding the electrolytic solution from an inlet formed in the battery lid 20.

Thereafter, the battery lid 20 is closely attached to the battery vessel 13 to seal the overall battery. When there is the inlet of the electrolytic solution, the inlet is also sealed. The method of sealing the battery employs known techniques such as welding and caulking.

A representative example of the electrolytic solution which can be used in the invention is a solution in which lithium hexafluorophosphate ($LiPF_6$) or lithium borofluoride ($LiBF_4$) as an electrolyte are dissolved in a solvent in which dimethyl carbonate, diethyl carbonate, ethylmethyl carbonate, or the like is mixed into ethylene carbonate. The invention is not limited to the type of the solvent or electrolyte and the mixing ratio of the solvent, and other electrolytic solutions can be used.

Examples of the non-aqueous solvent which can be used for the electrolytic solution include propylene carbonate, ethylene carbonate, butylene carbonate, vinylene carbonate, γ-butyrolactone, dimethyl carbonate, diethyl carbonate, methylethyl carbonate, 1,2-dimethoxyethane, 2-methyl tetrahydrofuran, dimethyl sulfoxide, 1,3-dioxolan, formamide, dimethyl formamide, methyl propionate, ethyl propionate, phosphate triester, trimethoxymethane, dioxolan, diethyl ether, sulfolane, 3-methyl-2-oxazolidinone, tetrahydrofuran, 1,2-diethoxyethane, chloroethylene carbonate, and chloropropylene carbonate. Other solvents may be used as long as they are not decomposed in the positive electrode 10 or the negative electrode 12 built in the battery according to the invention.

Examples of the electrolyte include various types of lithium salts such as $LiPF_6$, $LiBF_4$, $LiClO_4$, $LiCF_3SO_3$, $LiCF_3CO_2$, $LiAsF_6$, $LiSbF_6$, and imide salts of lithium representatively expressed by lithium trifluoromethane sulfone imide. An non-aqueous electrolytic solution in which the salts are dissolved in the solvent can be used as the electrolytic solution for a battery. Other electrolytes may be used as long as they are not decomposed in the positive electrode 10 or the negative electrode 12 built in the battery according to this embodiment.

When a solid polymer electrolyte (polymer electrolyte) is used, ion conductive polymers such as polyethylene oxide, polyacrylonitrile, polyvinylidene fluoride, polymethyl methacrylate, polyhexafluoropropylene, and polyethylene oxide can be used as the electrolyte. When these solid polymer electrolytes are used, there is an advantage that the separator 11 is not necessary.

An ionic liquid may be used. For example, a combination which is not decomposed in the positive electrode 10 and the negative electrode 12 can be selected from 1-ethyl-3-methylimidazolium tetrafluoroborate (EMI-$BF_4$), a mixed complex of a lithium salt $LiN(SO_2CF_3)_2$ (LiTFSI) triglyme, and tetraglyme, cyclic quaternary ammonium-based cations (such as N-methyl-N-propylpyrrolidinium), imide-based anions (such as bis(fluorosulfonyl)imide) and can be used for the battery 206 according to this embodiment.

The lithium ion battery control system according to this embodiment can be applied to such a battery using the lithium ion battery having the above-mentioned configuration as the battery 206.

An example (Example 1) and Comparative Examples 1 to 3 in which the battery 206 having the configuration shown in FIG. 5 is charged by the use of the lithium ion battery control system according to this embodiment will be described below.

Example 1

A lithium ion battery (battery) having the structure shown in FIG. 5 was first manufactured. Here, $LiNi_{1/3}Mn_{1/3}Co_{1/3}O_2$ was used as the positive-electrode active material and natural graphite (the distance between graphite layers ($d_{002}$) measured through the X-ray structure analysis was 0.336 nm) was used as the negative-electrode active material. An aluminum foil was used as the positive electrode and a copper foil was used as the negative electrode.

The manufactured battery as the battery 206 was charged by the use of the lithium ion battery control system shown in FIG. 1 and the battery characteristics were evaluated through the use of the below-described method. In the below-described method, degradation rates before and after charging and discharging the battery by a predetermined capacity were used as the present degradation rate and the previous degradation rate.

The manufactured battery was charged to 4.20 V with a current corresponding to 0.3 CA at the normal temperature (25° C.) more or less and was charged with a constant voltage of 4.20 V until the current reached 0.03 CA. After a break of 30 minutes, the battery was discharged to 3.0 V with a constant current corresponding to 0.3 CA. This process was repeated by 4 cycles to initialize the battery, the battery capacity of the fourth cycle was measured and the measured battery capacity was set as an initial battery capacity. The initial battery capacity was 1.15 Ah.

Then, the battery was charged to 4.20 V with a current corresponding to 0.3 CA at 25° C., was then charged with a constant voltage of 4.20 V until the current reached 0.03 CA, and was discharged for 10 seconds in the order of currents of 4 CA, 8 CA, 12 CA, and 16 CA while charging the battery with 0.3 CA as much as the discharged capacity. An initial DC resistance was calculated using the slope of a straight line in which the relations between the discharging currents and the voltage at the tenth second were plotted. A break of 30 minutes was interposed between the charging and the discharging. The measured initial DC resistance was 54.5 mΩ.

Then, 1000 charging and discharging cycles were performed at 25° C. In each cycle, the battery was charged to 4.20 V with a current corresponding to 0.3 CA and then was charged with a constant voltage of 4.20 V until the current reached 0.03 CA. The battery was discharged with constant power of 8 W so that the discharged power of one cycle is 1.5 Wh. A break of 1 hour was interposed between the charging and the discharging. The operation described in the following paragraph was performed every five cycles to measure a DC resistance.

The check of a degradation rate was performed in accordance with the flowchart shown in FIG. 3 every five cycles. ΔSOH was set to the difference between the initial DC resistance and the degraded DC resistance and a was set to 0.05 mΩ which is about 1% of the initial resistance. The charging and discharging condition was changed through the use of the method of lowering the upper-limit charging voltage by 0.05 V. The value of the upper-limit charging voltage to be lowered may be in the range of 0.01 V to 0.1 V. ΔSOH was stored and updated in the degradation rate storage unit 203 from the degradation rate comparing unit 204 every five cycles.

As a result, the degradation rate comparing unit 204 made a correction in the 90-th, 250-th, 420-th, 600-th, and 850-th cycles. The DC resistances at those times were 55.7 mΩ, 58.3 mΩ, 61.2 mΩ, 64.0 mΩ, and 68.3 mΩ, respectively.

Thereafter, after the battery was exposed to 25° C. for 12 hours, the battery was charged to 4.20 V with the corresponding current and was charged with a constant voltage of 4.20 V until the current reached 0.03 CA. After a break of 30 minutes, the battery was discharged to 3.0 V with a constant current corresponding to 0.3 CA and the battery capacity after 1000 cycles was measured, which was 0.904 Ah. Similarly to the measurement of the initial DC resistance, the DC resistance after 500 cycles was measured, which was 70.5 mΩ.

The battery capacity retention rate and the DC resistance increasing rate were calculated using the obtained results through the use of the following expressions. The results are shown in Table 1.

Battery Capacity Retention Rate (%)=(Battery Capacity after 500 Cycles)/(Initial Battery Capacity)

DC Resistance Increasing Rate (%)=(DC Resistance after 500 Cycles)/(Initial DC Resistance)

Example 2

Similarly to Example 1 except that the value of the constant power at the 1000-th cycle was changed from 8 W to 4 W, the cycle was repeated.

As a result, the degradation rate comparing unit made a correction in the 170-th, 450-th, 620-th, and 880-th cycles. The DC resistances at those times were 56.0 mΩ, 58.4 mΩ, 59.9 mΩ, and 62.2 mΩ, respectively.

Then, the battery capacity retention rate and the DC resistance increasing rate after 1000 cycles were calculated. The results are shown in Table 1. The initial battery capacity was 1.150 Ah, the initial DC resistance was 54.5 mΩ, the battery capacity after 1000 cycles was 0.987 Ah, and the DC resistance after 1000 cycles was 63.2 mΩ.

Comparative Example 1

Similarly to Example 1 except that the cycle was repeated without checking the degradation rate in 1000 charging and discharging cycles, the cycle was repeated and the battery capacity retention rate and the DC resistance increasing rate after 1000 cycles were calculated. The results are shown in Table 1. The initial battery capacity was 1.150 Ah, the initial DC resistance was 54.5 mΩ, the battery capacity after 1000 cycles was 0.745 Ah, and the DC resistance after 1000 cycles was 96.5 mΩ.

Comparative Example 2

Similarly to Example 2 except that the cycle was repeated without checking the degradation rate in 1000 charging and discharging cycles, the cycle was repeated and the battery capacity retention rate and the DC resistance increasing rate after 1000 cycles were calculated. The results are shown in Table 1. The initial battery capacity was 1.150 Ah, the initial DC resistance was 54.5 mΩ, the battery capacity after 1000 cycles was 0.855 Ah, and the DC resistance after 1000 cycles was 84.5 mΩ.

Comparative Example 3

Similarly to Example 1 except that the charging and discharging conditions were changed in 1000 charging and discharging cycles since the degradation exceeding 56.0 mΩ, 58.4 mΩ, 59.9 mΩ, and 62.2 mΩ where the charging and discharging conditions were changed in Example 2 appeared, the cycle was repeated and the battery capacity retention rate and the DC resistance increasing rate after 1000 cycles were calculated. The results are shown in Table 1. The initial battery capacity was 1.150 Ah, the initial DC resistance was 54.5 mΩ, the battery capacity after 1000 cycles was 0.785 Ah, and the DC resistance after 1000 cycles was 79.0 mΩ.

TABLE 1

Battery Capacity Retention Rate and DC Resistance Increasing Rate after 1000 Cycles

| | Check of Degradation Rate | Constant Power (W) | Battery Capacity after 1000 Cycles (Ah) | Capacity Retention Rate after 1000 Cycles (%) | Resistance Increasing Rate after 1000 Cycles (%) |
|---|---|---|---|---|---|
| Example 1 | done | 8.0 | 0.904 | 78.6 | 129 |
| Example 2 | done | 4.0 | 0.987 | 85.8 | 116 |
| Comparative Example 1 | none | 8.0 | 0.745 | 64.8 | 177 |
| Comparative Example 2 | none | 4.0 | 0.855 | 74.3 | 155 |
| Comparative Example 3 | Absolute value | 8.0 | 0.785 | 70.3 | 145 |

As shown in Table 1, in Example 1 and Example 2 in which the degradation rate was checked and the charging and discharging conditions were changed, the capacity retention rate and the resistance increasing rate were both superior, compared with Comparative Examples 1 and 2 in which the degradation rate was not checked and the charging and discharging conditions were not changed and Comparative Example 3 in which the charging and discharging conditions were changed with the absolute degradation. The constant power in Example 2 is smaller than the constant power in Example 1 and the degradation thereof is smaller than that in Example 2.

As described above, according to the invention, it is possible to provide a lithium ion battery control system with improved cycle characteristics which can suppress the increase in resistance and the decrease in battery capacity in a lithium ion battery even after 1000 charging and discharging cycles.

Figure 6:
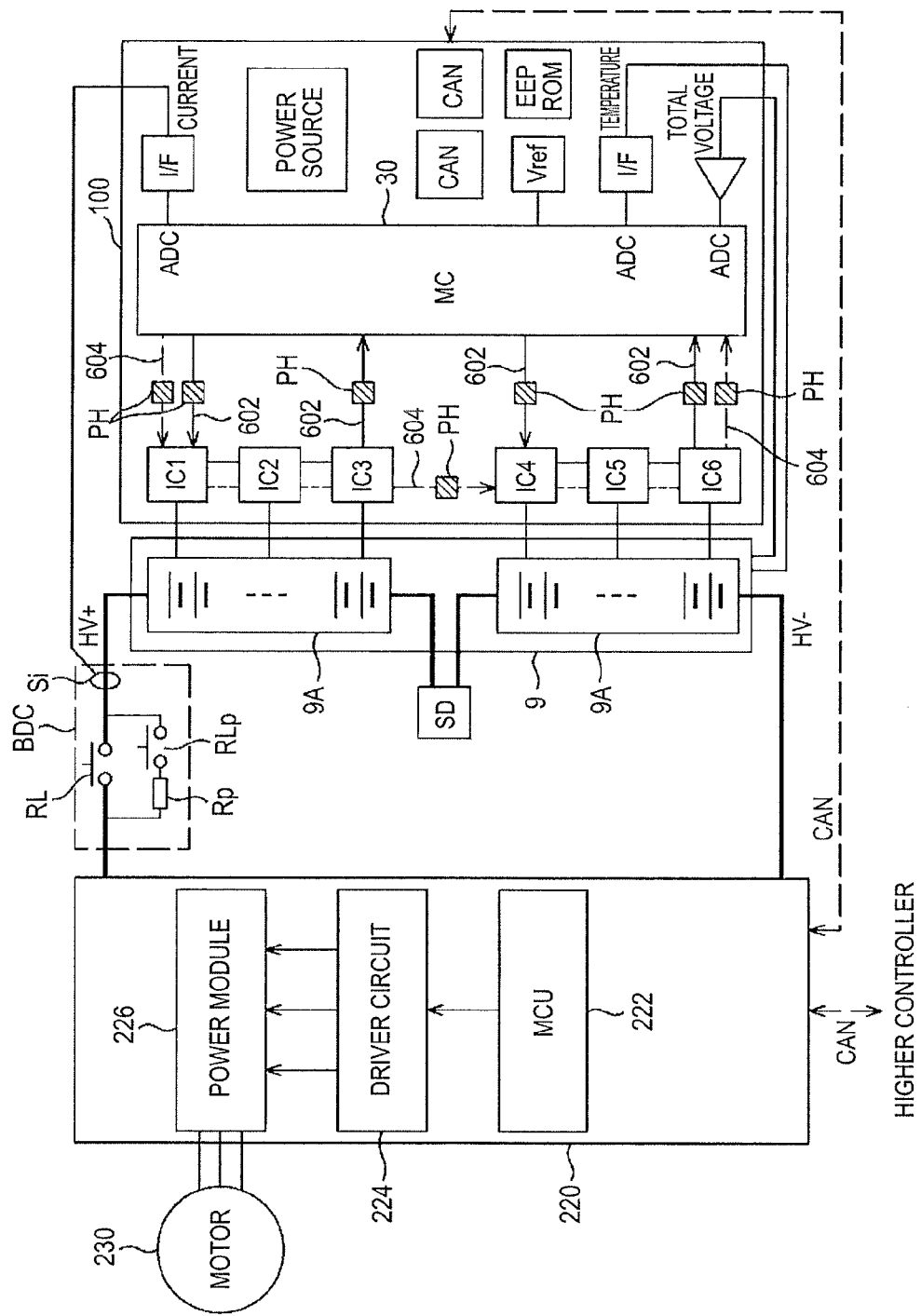
FIG. 6 is a diagram illustrating an example of a power supply device to which the lithium ion battery control system according to the embodiment can be applied and is a block diagram illustrating a driving system of a hybrid vehicle.
Figure 7:
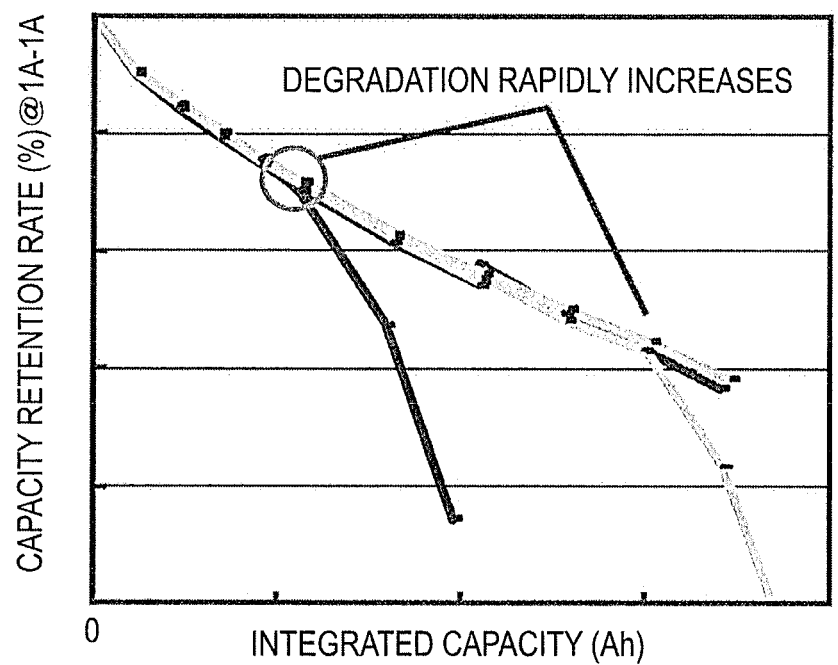
FIG. 7 is a diagram illustrating cycle degradation.

FIG. 6 is a diagram illustrating an example of a power supply device to which the lithium ion battery control system according to this embodiment can be applied and is a block diagram illustrating a driving system of a hybrid vehicle. The driving system shown in FIG. 6 includes a battery module 9, a battery monitoring device 100 monitoring the battery module 9, an inverter device 220 converting DC power from the battery module 9 into three-phase AC power, and a vehicle-driving motor 230. The motor 230 is driven with the three-phase AC power from the inverter device 220. The inverter device 220 and the battery monitoring device 100 are connected to each other via CAN communication and the inverter device 220 serves as a higher controller for the battery monitoring device 100. The inverter device 220 operates on the basis of instruction information from a still higher controller (not shown).

The inverter device 220 includes a power module 226, an MCU 222, and a driver circuit 224 driving the power module 226. The power module 226 converts the DC power supplied from the battery module 9 into the three-phase AC power used to drive the motor 230. Although not shown in the drawing, a large-capacity smoothing capacitor of about 700 μF to about 2000 μF is disposed between power supply lines HV+ and HV− connected to the power module 226. The smoothing capacitor serves to reduce voltage noise participated in an integrated circuit disposed in the battery monitoring device 100.

The charge in the smoothing capacitor at the time of starting up the inverter device 220 is substantially zero, and a large initial current flows in the smoothing capacity when a relay RL is closed. The relay RL may be fused and destroyed due to this large current. To solve this problem, the MCU 222 switches a precharge relay RLP from the open state to the closed state to charge the smoothing capacitor at the time of starting the driving of the motor 230 in accordance with an instruction from a still higher controller, and then switches the relay RL from the open state to the closed state to start the supply of power from the battery module 9 to the inverter device 220. When the charging of the smoothing capacitor is intended, the charging is performed while restricting the maximum current through the use of a resistor RPRE. By performing this operation, it is possible to protect the relay circuit and to reduce the maximum current flowing in the battery cells or the inverter device 220 to a predetermined value or less, thereby maintaining high safety.

The inverter device 220 controls the phase of AC power generated from the power module 226 for a rotor of the motor 230 and causes the motor 230 to serve as a generator at the time of braking the vehicle. That is, a regenerative braking control is performed to cause the battery module 9 to regenerate the power generated through the operation of the generator and to charge the battery module 9. When the state of charge of the battery module 9 is lower than a reference state, the inverter device 220 causes the motor 230 to operate as a power generator. The three-phase AC power generated from the motor 230 is converted into DC power by the power module 226 and is supplied to the battery module 9. As a result, the battery module 9 is charged.

On the other hand, when the motor 230 reversely operates, the MCU 222 controls the driver circuit 224 to generate a rotational magnetic field leading the rotation of the rotor of the motor 230 in accordance with an instruction of the higher controller and controls the switching operation of the power module 226. In this case, the DC power is supplied from the battery module 9 to the power module 226. When the battery module 9 is charged through the regenerative braking control, the MCU 222 controls the driver circuit 224 to generate a rotational magnetic field lagging behind the rotation of the rotor of the motor 230 and controls the switching operation of the power module 226. In this case, power is supplied from the motor 230 to the power module 226 and the DC power of the power module 226 is supplied to the battery module 9. As a result, the motor 230 serves as a power generator.

The power module 226 of the inverter device 220 performs the connecting and disconnecting operation at a high speed to convert the power between the DC power and the AC power. At this time, since a large current is blocked at a high speed, a large voltage variation occurs due to the inductance of the DC circuit. The large-capacity smoothing capacitor is provided to suppress the voltage variation.

The battery module 9 includes two battery blocks 9A and 9B connected in series. Each of the battery blocks 9A and 9B includes 16 battery cells connected in series. The battery block 9A and the battery block 9B are connected in series to each other via a maintenance service disconnecter SD in which a switch and a fuse are connected in series. By opening the service disconnecter SD, the DC circuit of the electric circuit is disconnected and no current flows even when one connected circuit is formed between any of the battery blocks 9A and 9B and the vehicle. By employing this configuration, it is possible to retain high safety. Even when a person comes in contact with the HV+ and HV− at the time of maintenance, a high voltage is not applied to a human body, which is safe.

The power supply line HV+ between the battery module 9 and the inverter device 220 is provided with a battery disconnecting unit BDU including a relay RL, a resistor RP, and a precharge relay RLP. The serial circuit of the resistor RP and the percharge relay RLP is connected in parallel to the relay RL.

The battery monitoring device 100 performs measurement of cell voltages, measurement of the total voltage, measurement of the current, adjustment of cell temperatures and cell capacities, and the like. Accordingly, integrated circuits IC1 to IC6 are provided as cell controllers. 16 battery cells disposed in each battery block 9A or 9B can be partitioned into three cell groups and one integrated circuit is provided for each cell group. The cell controller has a function of managing the corresponding cells and performs, for example, monitoring of the cell voltages, detecting of overcharging/over-discharging, and equalization of the cell voltages. The charging and discharging control circuit 205 and the voltage measuring unit 211 shown in FIG. 1 are disposed in the cell controller.

Each of the integrated circuits IC1 to IC6 includes a communication system 602 and a 1-bit communication system 604. The communication system 602 for reading a cell voltage value or transmitting various commands performs serial communication with the micro-computer 30 in a daisy chain mode via an insulating element (for example, a photo-coupler) PH. The 1-bit communication system 604 transmits an abnormal signal when the overcharging of a cell is detected. In the example shown in FIG. 6, the communication system 602 is divided into an upper communication channel of the battery block 9A with IC1 to IC3 and a lower communication channel of the battery block 9B with IC4 to IC6.

The micro-computer 30 has a function of a higher controller of the cell controllers (IC1 to IC6) and performs monitoring of the battery module 9 (monitoring of the total voltage, monitoring of the current, monitoring of the temperature, acquisition of information from the cell controllers, and the like), control of an external circuit (control of the relay, and the like), detection of the battery state (SOC calculation, SOH calculation, calculation of an allowable charging and discharging current, and the like), and various diagnoses (protection from overcharging, protection from over-discharging, detection of leakage, detection of disorder, and the like). The calculation processing unit 207 shown in FIG. 1 is disposed in the micro-computer 30.

A current sensor Si such as a Hall element is disposed in the battery disconnecter unit BDU and the output of the current sensor Si is input to the micro-computer 30. Signals on the total voltage and the temperature of the battery module 9 are also input to the micro-computer 30 and are measured by an AD converter (ADC) of the micro-computer 30. The temperature sensor is disposed at plural positions in the battery blocks 9A and 9B.

Although a lithium ion battery mounted on a vehicle has been exemplified in the above-mentioned embodiment, the invention is not limited to the application mounted on a vehicle, but may be applied to a lithium ion battery control system of a lithium ion battery used to store power generated through photovoltaic power generation or wind power generation and to supply the power to a power system.

The above-mentioned embodiments may be used singly or in combination. The advantages of the embodiments can be achieved singly or in synergy. The invention is not limited to the embodiments as long as the features of the invention are not damaged.

What is claimed is:

1. A lithium ion battery control system comprising:
   a charging and discharging control circuit that controls charging and discharging of a lithium ion battery;
   a degradation rate storage unit that stores a previous degradation rate of the lithium ion battery;
   a degradation rate calculating unit that calculates a present degradation rate of the lithium ion battery; and
   a degradation rate comparing unit that compares the present degradation rate with the previous degradation rate and that sends a signal for changing a charging and discharging condition of the lithium ion battery to the charging and discharging control circuit when the present degradation rate is greater than the previous degradation rate by a predetermined value.

2. The lithium ion battery control system according to claim 1, wherein degradation rates before and after charging and discharging the lithium ion battery by a predetermined capacity are used as the present degradation rate and the previous degradation rate.

3. The lithium ion battery control system according to claim 1, wherein the charging and discharging condition to be changed includes lowering an upper-limit charging current.

4. The lithium ion battery control system according to claim 1, wherein the charging and discharging condition to be changed includes lowering an upper-limit discharging current.

5. The lithium ion battery control system according to claim 1, wherein the charging and discharging condition to be changed includes lowering an upper-limit charging voltage.

6. The lithium ion battery control system according to claim 1, wherein the charging and discharging condition to be changed includes raising a lower-limit discharging voltage.

7. The lithium ion battery control system according to claim 1, wherein the degradation rate comparing unit compares the present degradation rate with the previous degradation rate and overwrites the previous degradation rate in the degradation rate storage unit with the present degradation rate when the present degradation rate is smaller than the previous degradation rate by the predetermined value.

8. The lithium ion battery control system according to claim 1, wherein the degradation rate calculating unit calculates the degradation rate after the charging and discharging condition is changed, and
   wherein the degradation rate comparing unit compares the degradation rate after the charging and discharging condition is changed with the previous degradation rate stored in the degradation rate storage unit and that sends a signal for changing a charging and discharging condition other than the changed charging and discharging condition to the charging and discharging control circuit when the degradation rate after the charging and discharging condition is changed is greater than the previous degradation rate stored in the degradation rate storage unit by a predetermined value.

9. An assembled battery control system controlling charging and discharging of an assembled battery, comprising:
   an assembled battery in which a plurality of lithium ion batteries are connected in series;
   a plurality of serial circuits that include a resistor and a balancing switch for causing a discharging current to flow independently in each of the plurality of lithium ion batteries;
   a control circuit that controls the balancing switches;
   an assembled battery calculation processing unit that controls charging and discharging of the assembled battery;

a degradation rate storage unit that stores previous degradation rates of the lithium ion batteries;

a degradation rate calculating unit that calculates present degradation rates of the lithium ion batteries; and a degradation rate comparing unit that compares the present degradation rates with the previous degradation rates and that sends a signal for restricting a charging and discharging condition of the assembled battery or the lithium ion batteries when the present degradation rates are greater than the previous degradation rates by a predetermined value.

10. The assembled battery control system according to claim 9, wherein degradation rates before and after charging and discharging the lithium ion batteries by a predetermined capacity are used as the present degradation rates.

11. The assembled battery control system according to claim 9, wherein the charging and discharging condition to be changed includes lowering an upper-limit charging current.

12. The assembled battery control system according to claim 9, wherein the charging and discharging condition to be changed includes lowering an upper-limit discharging current.

13. The assembled battery control system according to claim 9, wherein the charging and discharging condition to be changed includes lowering an upper-limit charging voltage.

14. The assembled battery control system according to claim 9, wherein the charging and discharging condition to be changed includes raising a lower-limit discharging voltage.

15. The assembled battery control system according to claim 9, wherein the degradation rate comparing unit has a function of comparing the present degradation rates with the previous degradation rates and overwriting the previous degradation rates in the degradation rate storage unit with the present degradation rates when the present degradation rates are smaller than the previous degradation rates by the predetermined value.

16. The assembled battery control system according to claim 9, wherein the degradation rate comparing unit independently discharges the lithium ion batteries by a predetermined capacity when the present degradation rates of the lithium ion batteries are greater than the previous degradation rates by a predetermined value.

\* \* \* \* \*